United States Patent [19]

Derby et al.

[11] Patent Number: 5,072,182
[45] Date of Patent: Dec. 10, 1991

[54] FOURIER SHIFTING OF VOXEL BOUNDARIES IN MR CHEMICAL SHIFT IMAGING SPECTROSCOPY

[75] Inventors: Kevin A. Derby, South San Francisco; K. Christine Hawryszko, Millbrae; James S. Tropp, Berkeley, all of Calif.

[73] Assignee: Diasonics, Inc., South San Francisco, Calif.

[21] Appl. No.: 379,234

[22] Filed: Jul. 13, 1989

[51] Int. Cl.[5] .............................. G01R 33/20
[52] U.S. Cl. .................................. 324/309; 324/312
[58] Field of Search ............... 324/300, 307, 309, 310, 324/311, 312, 313, 314, 318, 322, 319, 320; 128/653

[56] References Cited

U.S. PATENT DOCUMENTS

| | | | |
|---|---|---|---|
| 4,740,748 | 4/1988 | Rzedzian | 324/309 |
| 4,748,410 | 5/1988 | Macovski | 324/309 |
| 4,797,616 | 1/1989 | Matsui et al. | 324/309 |
| 4,851,779 | 7/1989 | DeMeester | 324/312 |
| 4,857,846 | 8/1989 | Carlson | 324/309 |
| 4,908,573 | 3/1990 | Kaufman et al. | 324/309 |

OTHER PUBLICATIONS

Brooker et al, "Selective Fourier Transform Localization", 5 *Magnetic Resonance in Medicine* 417–433 (1987).
Mareci, "High-Resolution Magnetic Resonance Spectra from a Sensitive Region Defined with Pulsed Field Gradients", 57 *Journal of Magnetic Resonance* 157–163 (1984).
"Characterization of MR Spectroscopic Imaging of the Human Head and Limb at 2.0T[1]", Tropp et al, Papers, Diasonics Inc., UCSF, Radiologic Imaging Lab, South San Francisco, Calif. 94080, 27 Oct. 1987.
"Metabolic Response of Glioblastoma to Adoptive Immunotherapy: Detection by Phosphorus MR Spectroscopy", Ross et al, Papers, Diasonics Inc., USCF, Radiologic Imaging Lab, South San Francisco, Calif. 94080, reprinted from *Journal of Computer Assisted Tomography*, Raven Press, New York, N.Y. 10036.

Primary Examiner—Michael J. Tokar
Attorney, Agent, or Firm—Nixon & Vanderhye

[57] ABSTRACT

In a phase encoded chemical shift imaging (CSI) system, phase shifting in k space is used to shift voxels so as to translate them in one or more dimensions so that one or more voxels maximally encloses an object of interest. The position of a structure of interest is located via a 1H "scout" image, and the Shift Theorem for finite Fourier transforms is applied to shift voxel boundaries in one, two or three dimensions so as to maximally enclose the structure in a minimal number of voxels. Voxel shifts thus may be accomplished computationally by minimal manipulation of the raw data—after the patient has left the imaging facility. The resulting spectral data corresponding to the structure of interest is not as subject to dilution by spectrum of the surrounding tissue.

8 Claims, 6 Drawing Sheets

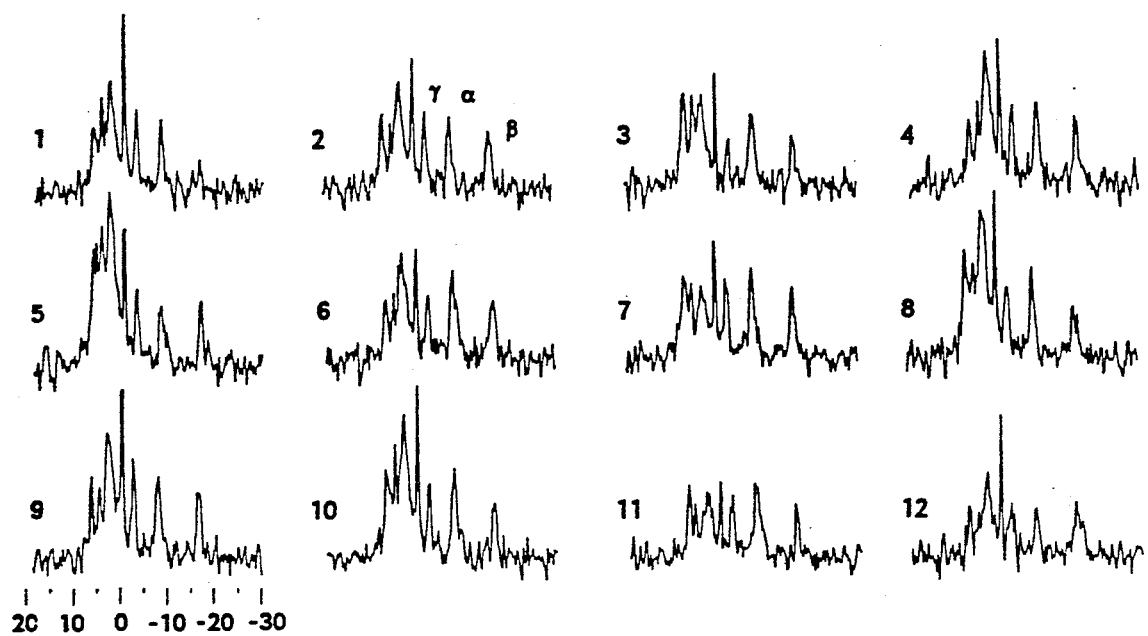
FIG. 6 A
FIG. 6 B
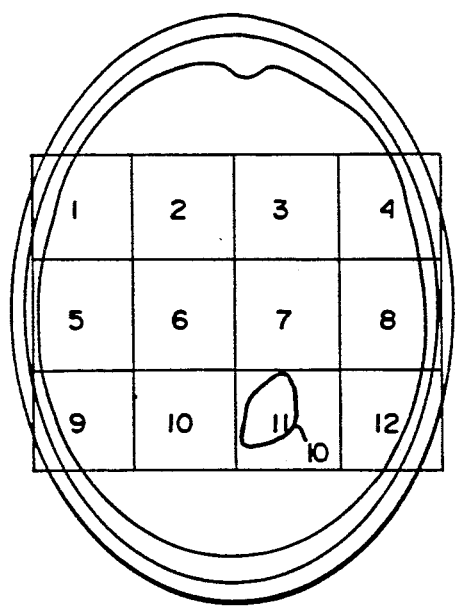

FOURIER SHIFTING OF VOXEL BOUNDARIES IN MR CHEMICAL SHIFT IMAGING SPECTROSCOPY

CROSS-REFERENCES TO RELATED APPLICATIONS

This application is related to application serial no. 07/293,859 of Kaufman et al., filed Jan. 5, 1989 entitled "3D Image Reconstruction Method for Placing 3D Structure Within Common Oblique or Contoured Slice-Volume Without Loss of Volume Resolution".

Application Ser. No. 07/293,859 and the disclosure contained therein is not "prior art" to the subject matter claimed herein because our work described in the subject application predates the work described in that copending, earlier filed application Ser. No. 07/293,859.

FIELD OF THE INVENTION

This invention generally relates to magnetic resonance imaging, and more particularly to spectroscopy using chemical shift images (CSI). Still more particularly, the invention relates to manipulating already acquired phase encoded CSI data so that plural slice-volumes of the original image can be shifted into a common slice-volume without loss of volume resolution.

BACKGROUND AND SUMMARY OF THE INVENTION

Phase-encoded CSI spectroscopy using MRI is generally known and in wide use. Some examples of prior art MRI methods and apparatus (including methods for three-dimensional image construction) may be found, for example, in prior issued U.S. Pat. Nos. 4,297,637; 4,318,043; 4,471,305; and 4,599,565. The contents of these referenced related patents are hereby incorporated by reference.

The following documents provide background concerning MR spectroscopic imaging procedures and results:

Tropp et al, "Characterization of MR Spectroscopic Imaging of the Human Head and Limb at 2.0T[1]," 169 Radiology 207 (1988); and Ross et al, "Metabolic Response of Gioblastoma to Adoptive Immunotherapy: Detection by Phosphorus MR Spectroscopy," 13(2) *Journal of Computer Assisted Tomography* 189 (March/April 1989).

In the subject disclosure, the terms "CSI" (Chemical Shift Imaging) and "MRSI" (Magnetic Resonance Spectrographic Imaging) will be used interchangeably.

As is already well known in the art, a three-dimensional MRI data set may be created in a number of ways. For example, nuclear magnetic resonance RF data may be elicited from a plurality of parallel contiguous slice-volumes and phase encoded in two different dimensions (e.g., x,y) so that the NMR hydrogen and one (or more) other NMR sensitive nuclear density may be calculated for each volume element (voxel) within a given slice-volume using two-dimensional Fourier transform techniques. Another known technique obtains nuclear magnetic resonance RF spectral data from an entire three-dimensional volume including phase encoding in three dimensions (e.g., x,y,z) which then produces similar voxel spectral values for plural substantially parallel and contiguous slice-volumes three dimensions of Fourier transformation.

As is known by those in the art, Fourier transformation 16 from the phase-encoded "K space" to the spatial domain in which each voxel has associated with it a frequency waveform indicating a spectrum eliciting using well-known phase-encoded CSI spectroscopy techniques, as well as additional Fourier transformation from time to frequency domain.

Maintaining acceptable sensitivity and signal to noise ratio in a CSI spectroscopic system is a particularly critical and difficult problem (as those skilled in this art well know)—particularly when it is desired to view the spectrum of relatively small structures (e.g., lesions within the human body). This problem has been exacerbated in the past due to the essentially arbitrary position of the structure of interest with respect to the "grid" defined by the Fast Fourier transform (FFT). The exact position of the object to be imaged with respect to the imaging apparatus is not always capable of being precisely controlled. Thus, structures internal to the object (e.g., lesions and the like) generally do not fall entirely within a single "voxel" resolution element defined by the FFT function but instead may exist at the boundaries between two or more voxels (and thus fall within two or more voxels). The usual form of the FFT used is typically to evaluate the function of interest on grid points $x_k = K\lambda/N$ (where lambda is the field of view and N is the number of points transformed). This evaluation function provides a set of voxel boundaries for the spectroscopic image which may "skewer" lesions or other structures one would like to determine the composition of.

FIG. 1, for example, shows an exemplary lesion (or other small structure of interest) 10 within a larger body (not shown). Voxels 12a-12d are part of a 3-D "grid" defined by the FFT evaluation applied to the raw acquired data. The lesion 10 shown in this example is smaller than each of voxels 12 but happens to contain the intersection point 14 between eight voxels (this is perhaps a "worst case" situation for a structure which is small relative to voxel volume or even comparable in size to voxel volume, since only a small portion of the lesion is within any one voxel).

Lesion 10 thus has its total volume divided between eight different voxels 12 (only four of the eight voxels are shown in FIG. 1, with four other voxels being "closer" to the viewer to the left of the four voxels shown). Only a small portion 16a of lesion 10 is contained within voxel 12a, for example, and this portion 16a is very small relative to the total volume of voxel 12a. Each of the other voxels 12 containing a part of lesion 10 in the example shown likewise contains a volume of the lesion which is small relative to the total voxel volume.

The spectral data corresponding to voxel 12a, in the example shown, will have a component attributable to lesion portion 16a, but will reflect mostly the tissue adjacent to the lesion 10 which occupies the remainder of voxel 12a—and a similar situation applies for each of the other voxels containing other portions of the lesion. Thus, the spectrum of lesion 10 (or other structure of interest) which overlaps the boundaries of several voxels is "diluted" with the spectral characteristics of the surrounding tissue. This effect may cause the unique features of the lesion spectrum to be obscured or even lost entirely—thereby diluting any pathologic manifestations of the lesion with spectra from normal tissue adjacent to the lesion.

Others have already recognized that it is possible to use suitable phase shifts in the "k space", or "wavevector space" so as to effect spatial translational shifting of the voxel matrix array in the resulting three-dimensional image—and that such phase shifting can be provided by using Fourier transform techniques.

For example, the shift theorem as such has thus been applied to medical imaging to solve the problem of interpolation between planes of a three-dimensionally Fourier encoded spatial image. See Leifer et al "NMR Volume Imaging with Half Slice Offsets", Soc. Mag. Res. Med., Book of Abstracts, 4th Annual Meeting (August 19-23, 1985, Volume 1, pp 1013-1014).

Kaufman and Kramer (see referenced copending patent application above) have extended the range of the application of the shift theorem to allow facile viewing of oblique slices or even curved laminas. However, all these applications have a common thread: avoidance of the problems of interpolation between image points when a non-standard view is desired.

Messrs. Twieg et al ("An Improved Spectroscopic Imaging(SI) Technique for Localized Phosphorus NMR Spectroscopy; Direct Comparison of SI and ISIS in Human Organs," Soc. Mag. Res. Med., 7th Annual Meeting, August 20-26, 1988, Vol. 2) also mentioned that "spectra can be reconstructed from any number of individual volumes of interest (VOIs), at locations chosen after data acquisition." However, Twieg et al do not give any information at all as to how this process is to be effected (e.g., whether by various spatial domain interpolation techniques or frequency domain phase shifts, or some method distinct from either of these).

However, we have now ascertained that phase shifting in the K space may be utilized to shift the voxels in magnetic resonance spectroscopic images so as to translate them in (e.g., in two dimensions, such as x and y dimensions). Briefly, in accordance with one aspect of our invention, we locate the position of a structure of interest via conventional means (e.g., by generating a 1H "scout" image). We then apply the shift theorem for finite Fourier Transforms to shift voxel boundaries preferably in two (or more) dimensions so as to maximally enclose the lesion in a single voxel. Voxel shifts can be accomplished computationally by minimal manipulation of the raw data—and can thus be performed after the patient has left the imaging facility.

Thus, our application is quite different in motivation from those that have used the shift theorem in the past so as to avoid interpolation problems associated with non-standard views. Our desire is to ensure that the voxel boundaries in a spectroscopic image are placed so as to maximally or optimally enclose any lesion of interest, as located in a scout image. Our method is equally applicable for any phase encoded spectroscopic imaging experiment, regardless of whether one, two, or three dimensions of space encoding are employed.

Briefly, it is well known in information theory that a periodic signal with a high frequency cut off can be faithfully represented by a Fourier series with a finite number of terms. Therefore, a finite collection of Fourier coefficients suffices for the representation of a continuous function, which may be evaluated at any of an infinite number of points on a continuous domain. These considerations apply equally for signals in the time domain, where the Fourier transform is calculated in the frequency space; or for functions of space coordinates (e.g., images), where the transform is calculated in wave vector, or "k" space. Furthermore, they apply to objects with spatial extension in two or three dimensions.

For simplicity, we consider an example in one dimension:

$$f(x) = \Sigma F_n \exp(2\pi i n x/\lambda) \qquad \text{Equation 1}$$

where the sum over n is from $-N/2$ to $N/2-1$, i.e., over a finite number of terms. Then the function can be obtained at any of an infinite number of values by changing the value of the variable x, while still using the same finite collection of Fourier coefficients, $F_n$.

The advent of the Fast Fourier Transform (FFT), which relies exclusively on the finite Fourier transform, changes the ground rules for evaluating an expanded function at an arbitrary point, as follows. The expanded function is evaluated on a predetermined grid of points, which are obtained by dividing the field of view into an integral number of steps, including the end points. The number of points equals the number of coefficients, so (naively) the points at which the function can be evaluated ar irrevocably fixed. In fact, we have discovered that the limitation implied in the naive view can be overcome by an application of the shift theorem for Fourier transforms as applied to the finite transform. In naive terms, this is tantamount to shifting the grid of observation points by a small amount, so that the end points of the grid no longer coincide with the extremal points of the field of view.

These as well as other objects and advantages of this invention will be more completely understood and appreciated by studying the following more detailed description of presently preferred exemplary embodiments of this invention in conjunction with the accompanying drawings of which:

FIG. 5A-5B and 6A-6B, respectively graphically and systematically show MR spectroscopy results without and with voxel shifting in accordance with the present invention.

Figure 3:
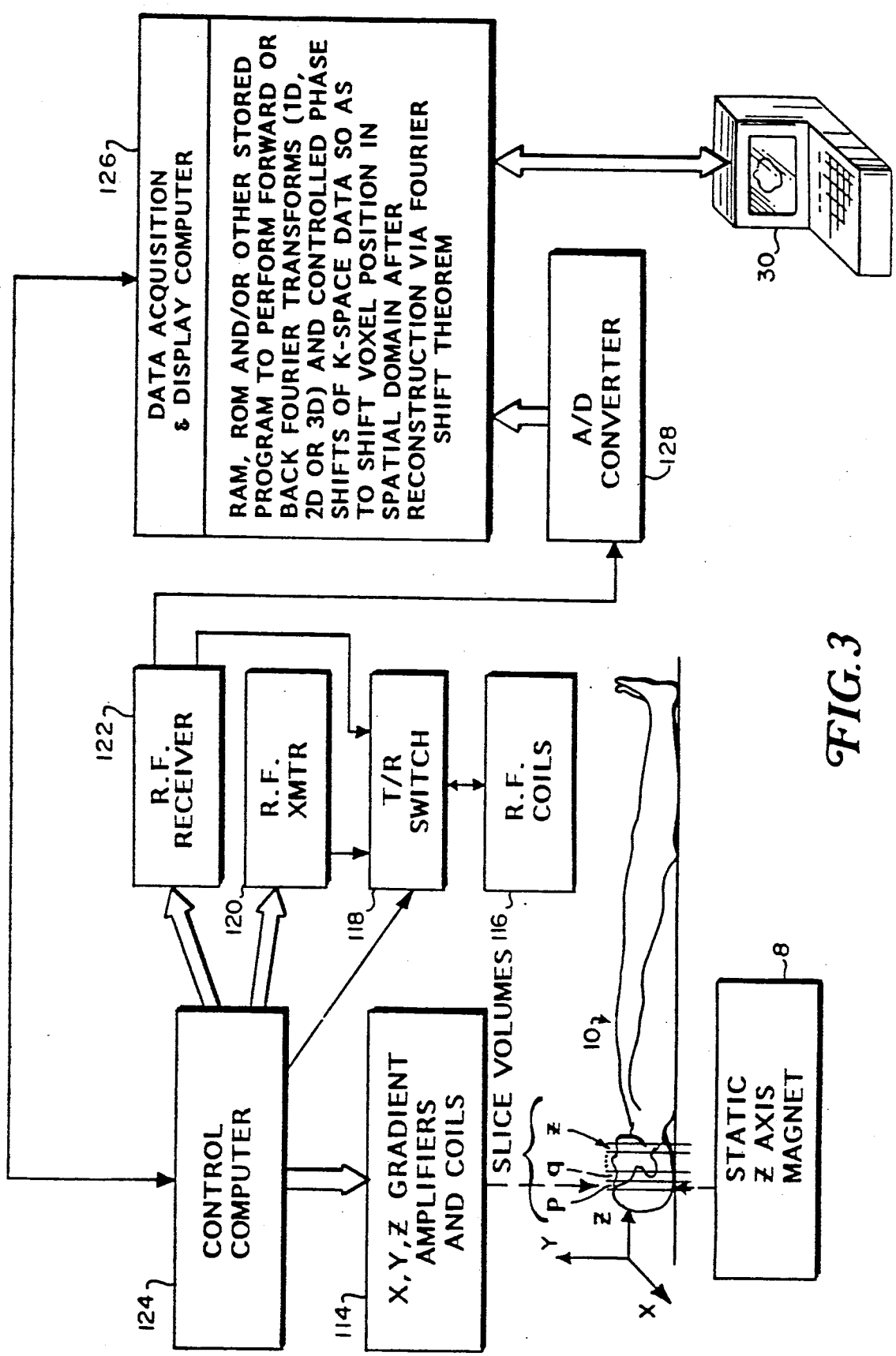
FIG. 3 is a schematic simplified representation of a typical preferred embodiment magnetic resonance imaging system modified so as to practice this invention.

The novel spectroscopic image processing procedure utilized by this invention typically can be achieved by suitable alteration of stored controlling computer programs in existing MRI CSI type spectroscopic apparatus. As an example of such typical apparatus, the block diagram of FIG. 3 depicts the general architecture of such a system.

Typically, a human or animal subject (or any other object to be imaged) 110 is placed within a static magnetic field. For example, the subject may lie along the z-axis of a static magnet 108 which establishes a substantially uniform magnetic field directed along the z-axis within the portion of the object 110 of interest. For example, contiguous parallel slice-volumes p,q...z may be located within the volume to be imaged. Gradients may be imposed within this z-axis directed magnetic field along mutually orthogonal x,y,z axes by a set of x,y,z gradient amplifiers and coils 114 to phase encode the resulting NMR response signals which are generally then read out with the gradients turned off. NMR RF signals are transmitted into the object 110 and NMR RF responses are received from the object via RF coils 116 connected by a conventional transmit/receive switch 118 to an RF transmitter 120 and RF receiver 122. As will be appreciated by those in the art, separate transmit and receive coils may be used in some installations in which case the T/R switch 118 may not be needed.

All of the prior mentioned elements may be controlled, for example, by a control computer 124 which communicates with a data acquisition and display computer 126. The latter computer 126 may also receive NMR responses via an analog-to-digital converter 128. A CRT display and keyboard unit 130 is typically also associated with the data acquisition and display computer 126.

Figure 4:
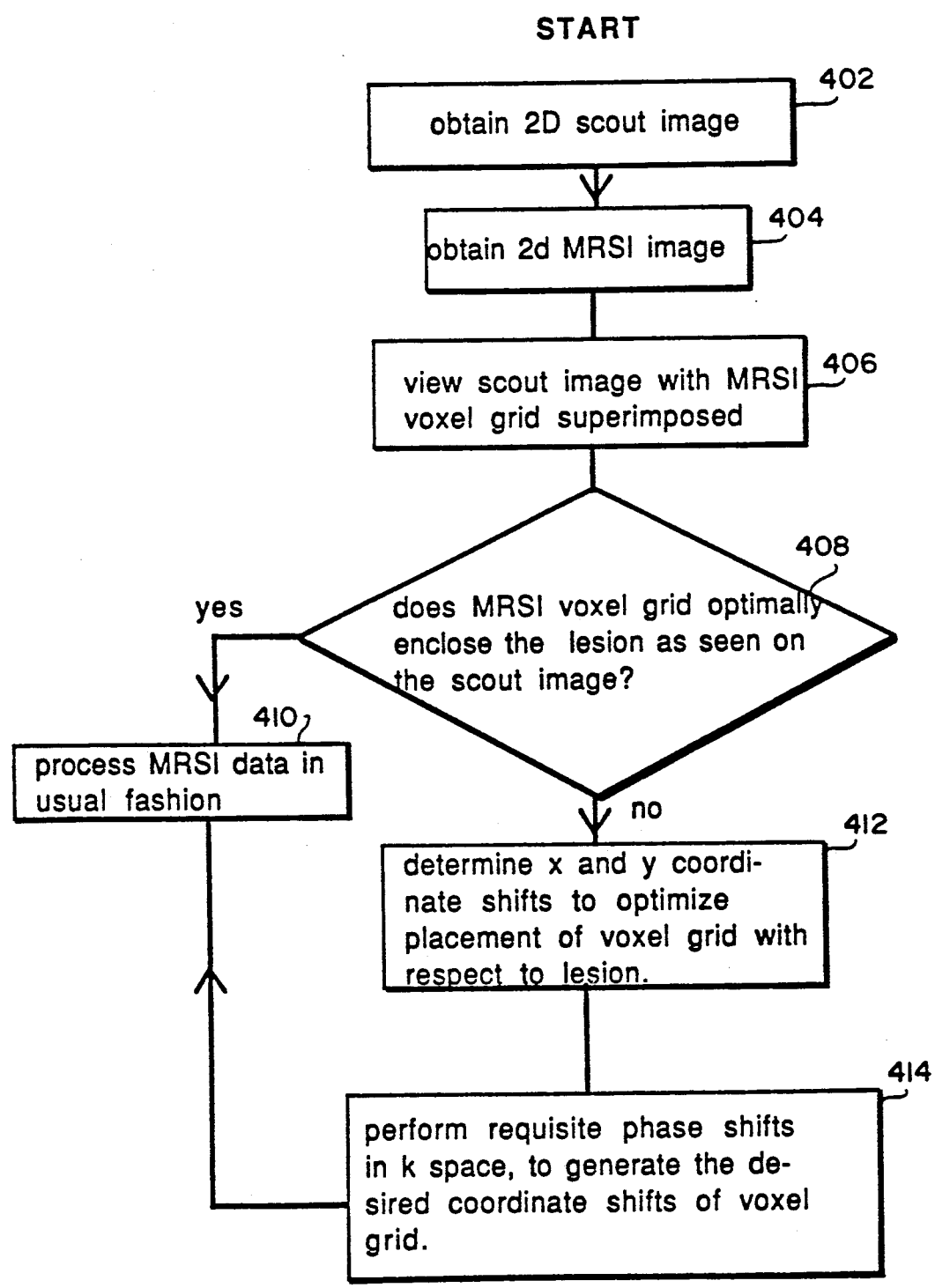
FIG. 4 is a simplified flowchart of a suitable computer program which may be utilized in conjunction with the system of FIG. 1 so as to adapt it for achieving optimal voxel positioning for determining spectroscopic information.
Figure 4A:
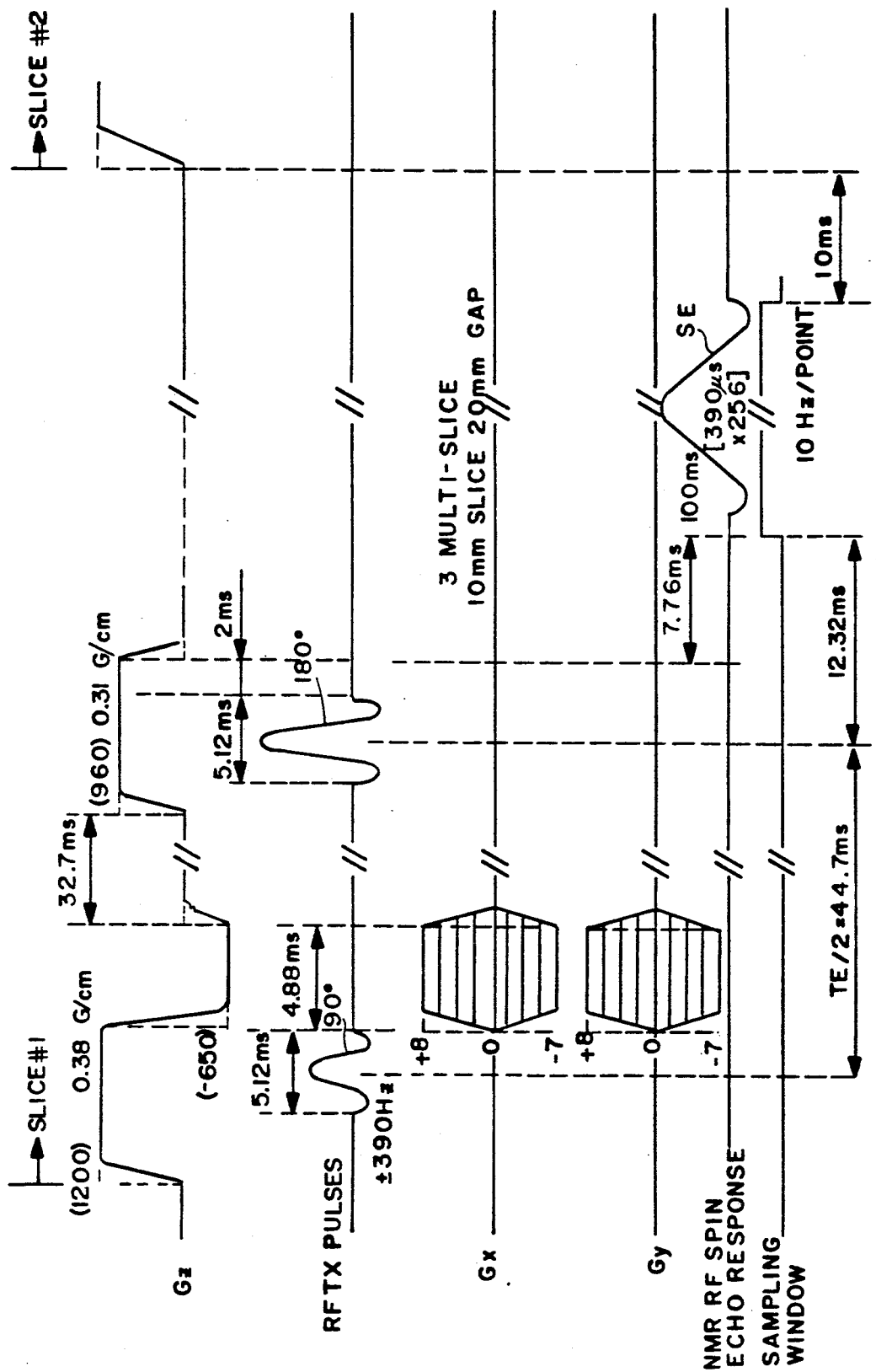
FIG. 4A is a timing diagram of exemplary gradient and RF transmit pulses used in the exemplary embodiment to acquire non-frequency encoded NMR spin-echo responses for use with the preferred embodiment voxel shifting techniques.

As will be apparent to those in the art, such an arrangement may be utilized so as to generate desired sequences of magnetic gradient pulses and NMR RF pulses and to measure the desired NMR RF responses in accordance with stored computer programs (see FIG. 4A, which shows an exemplary "spin-echo" acquisition sequence). As depicted in FIG. 3, the NMR system of this invention will typically include RAM, ROM and-/or other stored program media adapted (in accordance with the descriptions herein) so as to perform requisite forward or inverse Fourier transforms (in 1, 2 or 3 dimensions), to produce controlled variable phase shifts of K space data followed by reconstruction of the phase shifted data using Fourier transforms so as to shift voxel position in three dimensions in the spatial domain after reconstruction via the Fourier shift theorem.

Consider a one dimensional object, described by a density function p(x), and imaged by N steps of phase encoding. Let the field of view be λ (lamda) and denote the usual finite Fourier transform representation of p(x) by f(x). The function f is merely the convolution of p with the appropriate finite Fourier kernel, and is customarily evaluated at grid points $x_k = k/N$, with k running from $-N/2$ to $N/2-1$. We then write $f(x_k)$ as f(k), given by $$f(k) = \Sigma F_n \exp(2\pi i k n/N) \quad \text{Equation 2}$$

where $F_n$ = is the Fourier coefficient:

$$F_n = \int p(x) \exp-(2\pi i n x/\lambda) dx \quad \text{Equation 3}$$

and the sum in Equation 2 is from $-N/2$ to $N/2-1$.

To evaluate f at a location not on the grid defined by the $x_k$, we consider a point lying between $x_k$ and $x_{k+1}$. We denote the fractional displacement by δ, where $|\delta|=1$ represents a shift of one voxel. The shifted position coordinate is given by $(k+\delta)\lambda/N$, leading to $$f(k+\delta) = \Sigma F_n \exp[2\pi i(k+\delta)n/N] \quad \text{Equation 4}$$

which may be re-written as $$f(k+\delta) = \Sigma F_n' \exp[2\pi i k n/N] \quad \text{Equation 5}$$

where $$F_n' = F_n \exp[2\pi i \delta n/N]. \quad \text{Equation 6}$$

Equations 5 and 6 are nothing more than an expression of the Shift Theorem for finite Fourier transforms. δ may be positive or negative, and may be greater than 1, indicating shifts of more than one voxel. Voxel shifts may therefore be accomplished computationally by minimal manipulation of the $F_n$, which constitute the raw data.

The most general shift of three orthogonal increments, $\delta_1$, $\delta_2$, and $\delta_3$, is given in the following expression:

$$f(t, h+\delta_1, j+\delta_2, k+\delta_3) = \Sigma F_{lmn}(t) \exp[2\pi i\{(h+\delta_1)l + (j+\delta_2)m + (k+\delta_3)n\}/N].$$

It is assumed here that no transformation has been applied in the time domain, so that the function f represents the time domain NMR transient arising from the appropriate localized voxel. The restrictions of this expression to two and one dimensions of phase encoding are:

$$f(t, h+\delta_1, j+\delta_2) = \Sigma F_{lm}(t) \exp[-2\pi i\{(h+\delta_1)l + (j+\delta_2)m\}/N],$$

$$f(t, h+\delta_1) = \Sigma F_L(t) \exp[2\pi i\{(h+\delta_1)l\}/N].$$

respectively

Such voxel shifting can be extended to images acquired using two or three dimensions of phase encoding and to phase encoded spectroscopic images, which are acquired with two or three dimensions of phase encoding plus a sampling period of free precession in a homogeneous field, and processed by Fourier transformation with respect to the two encoding gradients and time. ("Free precession" refers to removal of the RF and gradient magnetic field.) As is known in the art, this produces an array of spectra, each assignable to a specific voxel location in space.

Figure 2:
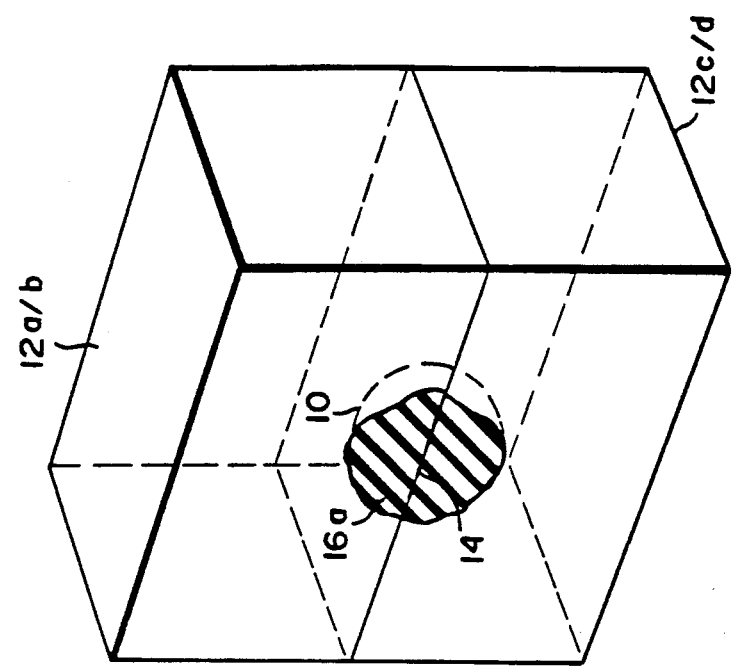
FIGS. 1 and 2 are simplified schematic illustrations of prior art situations in which spectral information obtained via CSI is diluted by spectra of surrounding tissue.
Figure 1:
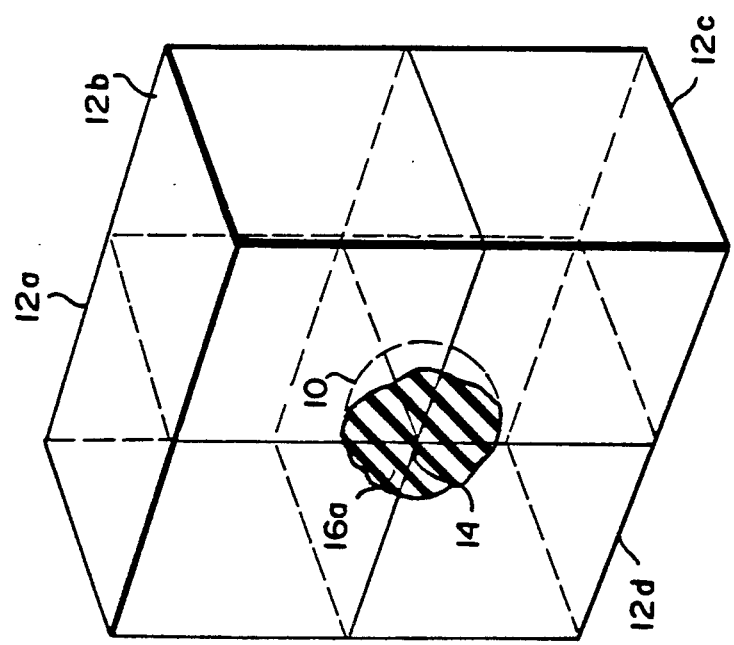

Translational voxel shifting in spectroscopic imaging can be useful where it is desired to view the spectrum of a lesion which may overlap the boundaries of two or more voxels (as shown in FIG. 1) if calculated with respect to the usual grid points. Since the overlap essentially dilutes the spectrum of the lesion with those of the normal surrounding tissue, the unique features of the lesion spectrum may be lost. Voxel shifting enables one to obtain the clearest possible view of lesion spectra in a spectroscopic image by translating the voxel grid in three dimensions so as to maximally encompass the lesion.

We therefore have determined a method for translationally shifting the voxel boundaries of spectra obtained by spectroscopic imaging by use of the Shift Theorem for Fourier transforms, applied a posteriori to the usual spectroscopic data set.

FIG. 4 depicts one possible general organization of a computer program modification for the computer 26 in a typical MRI system so as to implement this invention.

A two-dimensional "scout" image and a two-dimensional (e.g., MRSI) image are conventionally obtained at 402, 404 respectively. Then, at 406, the "scout" image obtained at 402 is viewed with the Fourier Transform generated voxel grid superimposed on it to determine whether a given structure 10 of interest is optimally (or at least suitably) enclosed by a minimum number of voxels. If so, then shifting of the voxel boundaries in one or more axes is not necessary and the MRSI data is processed in the usual fashion (block 410).

If, however, it is determined at 408 that voxel shifts in any of the x and y dimensions are needed to optimally place the three-dimensional structure 10 of interest into a common single (or smaller number of) voxels, then at 414 the requisite differing phase shifts are performed (e.g., by one or more applications of the Fourier shift theorem) using K space data. If the original image has been obtained using Fourier transform processes, then the already available actual data set as it already exists prior to one or more dimensions of Fourier transformation may itself be phase shifted. Alternatively, one or more dimensions of inverse Fourier transformation may be utilized so as to get the required K space data along the axis (or axes) to be shifted.

Finally, at 410, the shift MRSI data is processed in the usual (conventional) fashion—with one voxel ("slice-volume") now maximally enclosing the specified three-dimensional structure 10 of interest. This resulting data is analyzed/imaged for spectral content in a conventional manner.

Since it is well-known that Fourier Transformation calculation processes in k space can also be effected by equivalent convolution calculation processes in the spatial domain, it will be understood that such equivalent spatial domain convolution processes are, for purposes of this invention and the following claims, to be considered within the definition of K space transformation processes.

As to possible time savings, some real economy is achieved through using the inverse Fourier representation of the appropriate filter. However, this invention may include a further economy if shifts are performed only parallel to one axis.

Figure 5A:
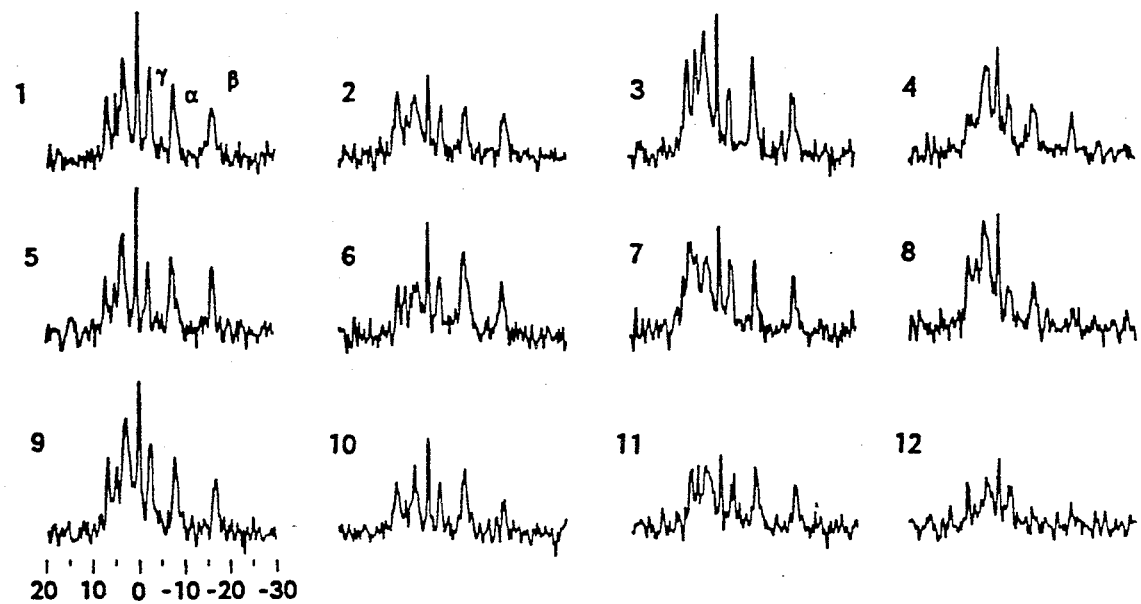
Figure 5B:
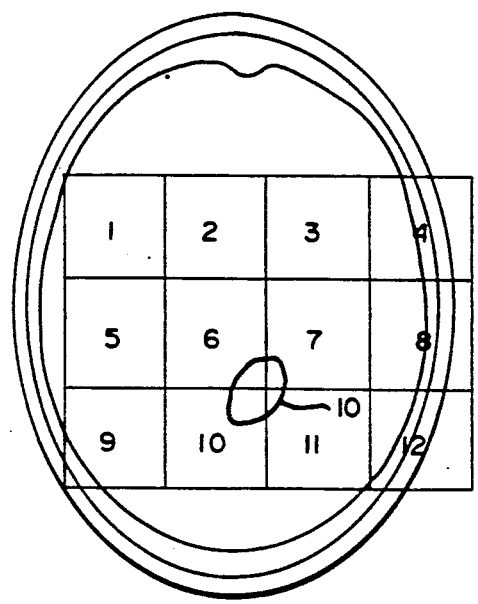

FIGS. 5A and 5B illustrate the results of an actual experiment before voxel shifting as described herein was applied. FIG. 5B schematically shows a proton "scout" image of a human brain with a right hemispherical lesion 10 non-optimally located within voxels 6,7,10 and 11 of a 3 cm$^2$ voxel "grid." FIG. 5A shows P MR spectroscopy results derived for the FIG. 5A brain using the voxel grid shown in FIG. 5A. See Ross et al, "Metabolic Response of Glioblastoma . . ." (cited above) at pages 190–191 for more information about this experiment.

FIG. 6B shows the same human brain scout image with the voxel grid shifted, in accordance with the preferred embodiment of the present invention, in two dimensions so that a single shifted voxel 1 1 now optimally encloses lesion 10 of interest. The resulting spectra are shown in FIGURE 6A. Note the increased P intensity in some of the voxels (e.g., voxel 10)—providing much better contrast with the reduction in intensity in ATP, PDE and PCr peaks for voxel 11 due to the composition of the lesion 10 of interest.

While only a few exemplary embodiments of this invention have been described in detail, those skilled in the art will recognize that many variations and modifications may be made in these exemplary embodiments while yet retaining many of the novel features and advantages of this invention. Accordingly, all such variations and modifications are intended to be included within the scope of the appended claims.

What is claimed is:

1. A phase-encoded chemical shift imaging (CSI) processing method for reconstructing the spectrum of a structure disposed within plural voxels of a chemical shift image, said chemical shift image having one to three spatial dimensions, into a smaller number of voxels so that the spectrum corresponding to said object can be concentrated into the smallest possible number of said voxels consistent with the spatial resolution of said image, said method comprising the steps of:

(a) determining, in the spatial domain within said image, an axis shift in each of first, second and third dimensions required to place a larger portion of said structure within a smallest number of said voxels;

(b) performing corresponding requisite variable phase shifts on k space data so as to shift said smallest number of voxels in of said first, second and third dimensions to bound said larger structure portion; and (c) transforming the thus phase shifted k space data to produce a new array of spectra as a function of spatial location, one or more of said spatial locations corresponding to said smallest number of voxels.

2. A method as in claim 1 wherein step (b) includes processing said k space data by applying the Fourier shift theorem at least once.

3. A phase-encoded chemical shift imaging (CSI) processing apparatus for reconstructing the spectrum of a structure disposed within plural voxels of a chemical shift image having one, two or three dimensions into a smaller number of voxels so that the spectrum corresponding to said object can be concentrated into the smallest possible number of said voxels consistent with the spatial resolution of said image, said apparatus comprising:

means for determining in the spatial domain within said image, an axis shift in each of said first, second and third dimensions required to place a larger portion of said structure within a single voxel;

means operative coupled to said determining means for performing corresponding requisite variable phase shifts on k space data so as to shift said single voxel in said of said first, second and third dimensions to bound said larger structure portion; and means connected to said performing means for transforming the thus phase shifted k space data to produce a new array of frequency domain spectra as a function of spatial location, one of said spatial locations corresponding to said single voxel.

4. Apparatus as in claim 3 wherein said performing means includes means for processing said K space data by applying the Fourier shift theorem at least once.

5. Apparatus as in claim 3 further including output means connected to said transforming means for providing spectral information as a function of spatial location in response to said transformed phase-shifted frequency domain data.

6. Phase encoded chemical shift imaging MRSI apparatus for producing spectral frequency domain data representing the composition of an object of interest as a function of spatial location in response to NMR response received from a three-dimensional (x,y,z) array of voxels the locations of which are defined in response to at least one Fourier Transformation of acquired k space data representing said NMR responses, said apparatus including:

means for applying a variable phase shift to said k space data in each of said x, y and z dimensions so as to shift said array of voxels such that a selected one of said voxels maximally encloses said object of interest; and means for applying at least one forward Fourier transformation to said phase shifted data so as to derive said spectral frequency domain data.

7. A phase encoded chemical shift imaging MRSI processing method for producing spectral data representing the composition of an object of interest as a function of spatial location in response to NMR responses received from a three-dimensional (x,y,z) array of voxels the locations of which are defined in response to at least one Fourier Transformation of acquired frequency domain data representing said NMR responses, said method including the following steps:

(a) acquiring k space data corresponding to said object of interest;

(b) ascertaining whether said object of interest contributes to the spectral data with respect to more than an optimally minimal number of said voxels; and (c) if the ascertaining step reveals said object does contribute to said spectral data with respect to more than a optimally minimal number of said voxels, then performing the following additional steps:

(c1) determining a desired shift in spatial location in each of said x, y and z dimensions of a selected spatially shifted voxel, (c2) determining phase shifts corresponding to said determined spatial location shift in each of said x, y and z dimensions, (c3) applying said determined phase shifts to said k space data, including the step of applying the Fourier Shift theorem in each of said x, y and z dimensions so as to shift said array of voxels such that said selected voxel maximally encloses said object of interest, and (c4) applying at least one forward Fourier transformation to said phase shifted k space data so as to derive said spectral data corresponding to said selected voxel.

8. A phase encoded chemical shift imaging MRSI processing method for producing spectral data representing the composition of an object of interest as a function of spatial location in response to NMR responses received from an array of voxels the locations of which are defined in response to at least one Fourier Transformation of acquired data representing said NMR responses, said method including the following steps:

(a) acquiring k space data corresponding to said object of interest;

(b) ascertaining whether said object of interest contributes to the spectral data with respect to more than an optimally minimal number of said voxels defined by said Fourier Transformation;

(c) if the ascertaining step reveals said object does contribute to said spectral data with respect to more than a optimally minimal number of said voxels, then shifting the spatial location of at least one of said voxels in at least one dimension so as to concentrate the spectral information corresponding to said object into a smaller number of said voxels, including the step of applying the Fourier Shift theorem to said acquired K-space data; and (d) applying at least one forward Fourier transformation to said shifted K space data so as to derive said concentrated spectral data corresponding to said object.

* * * * *